US006696881B1

(12) United States Patent
Ho

(10) Patent No.: US 6,696,881 B1
(45) Date of Patent: Feb. 24, 2004

(54) METHOD AND APPARATUS FOR GATE CURRENT COMPENSATION

(75) Inventor: Kenneth Ho, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/358,500

(22) Filed: Feb. 4, 2003

(51) Int. Cl.$^{7}$ .............................................. H03K 17/687

(52) U.S. Cl. ........................ 327/427; 327/538; 327/362; 323/315

(58) Field of Search ................................. 327/311, 312, 327/317, 341, 362, 427, 434, 437, 538, 540, 541, 543, 581; 323/315, 316

(56) References Cited

U.S. PATENT DOCUMENTS 5,521,490 A * 5/1996 Manohar .................... 323/315
6,255,897 B1 * 7/2001 Klemmer .................... 327/538
6,617,835 B2 * 9/2003 Nishimura .................. 323/315

* cited by examiner

*Primary Examiner*—Long Nguyen
(74) *Attorney, Agent, or Firm*—Gunnison, McKay & Hodgson, L.L.P.; Philip J. McKay

(57) ABSTRACT

A method and apparatus for compensating for gate current through a first capacitor includes: a biasing circuit; a first compensation transistor; a second compensation transistor; and a compensation capacitor. The biasing circuit ensures the bias voltage across the compensation capacitor is equal to the bias voltage across the first capacitor. In addition, the size of the second compensation transistor is chosen such that if, the ratio of the area of the compensation capacitor divided by the area of the first capacitor is area ratio "AR", then, the ratio of the size of first compensation transistor divided by the size of second compensation transistor is also area ratio "AR". As a result, according to the method and apparatus of the present invention, the gate current Ig through the first capacitor is equal to the current drained off through second compensation transistor.

22 Claims, 2 Drawing Sheets

METHOD AND APPARATUS FOR GATE CURRENT COMPENSATION

FIELD OF THE INVENTION

The present invention relates generally to CMOS circuits and, more particularly, to compensation for gate current leakage in CMOS circuits.

BACKGROUND OF THE INVENTION

It is common practice to use the existing oxide layer as a dielectric for making a PMOS device into a capacitor. A typical configuration for making a PMOS device into a capacitor is to connect the source and the drain, also collectively called diffusions in this configuration, and the N-well tie to a first supply voltage, typically Vdd. The gate is then connected to the desired node, which is typically coupled to other devices such as a filter in a Phase-Locked-Loop (PLL) application. Typically, the desired node has a more negative potential on it than the potential on the source and the drain, i.e., the diffusions.

In this capacitor configuration of a PMOS device, there is a minute, typically negligible in the prior art, DC current flowing from the source and drain, i.e., the diffusions, through the oxide layer of the device to the gate terminal. This DC current flowing from the source and the drain to the gate is a parasitic current known to those of skill in the art as “gate current”.

In the prior art, the thickness of the oxide layer making up the gate was large enough that the gate current was minimal and considered negligible and, therefore, was often ignored, however, to accommodate smaller feature sizes, faster clock speeds and advances in low power circuits, the thickness of gate oxide layers has been steadily decreasing. Indeed, at the time of this application gate oxide layer thickness is approaching 20 angstroms and will soon be even thinner. Consequently, the ability of the gate oxide layer to insulate, and thereby keep the gate current minimal, is constantly decreasing. As a result, in the current electronics design industry, gate current can no longer be, and no longer is, considered negligible.

Unfortunately, gate current may vary as an exponential function of the voltage between the gate and the source (Vgs) of the PMOS device. In addition, when the PMOS device is configured as a capacitor, i.e., the oxide layer is used as the dielectric of a capacitor, it is particularly difficult to compensate for gate current because the gate must remain a “floating node” for an extended period of time and therefore cannot be driven by any external voltage source to create a corrective biasing Vgs.

Gate current is particularly problematic when the PMOS device, configured as a capacitor as discussed above, is used as a filter capacitor in a PLL. Some prior art solutions have been attempted to solve the problem of gate current, however, these solutions: tended to significantly change the characteristics of the capacitor, and therefore affect the efficiency and operational parameters; were often based on the use of non-standard, ultra precise custom components; and/or required a prohibitively large number of additional components.

For instance, prior art “work around” solutions included reducing the operational range of the capacitor or changing the diffusion and well voltage potentials to match the gate potential. Another prior art “solution to the gate current problem was to use two identical capacitors, each having one-half the capacitance of the active capacitor. According to this prior art “solution”, one capacitor was configured like the active capacitor and the other capacitor was connected to the floating node while the poly layer was connected to the second supply voltage, Vss. The thought behind this prior art “solution” was to drain off a current equal to the gate leakage current. However, two capacitors rarely have identical characteristics and prior art this “solution” required three capacitors.

As discussed above, the prior art “solutions” shown above tended to significantly change the characteristics of the capacitor, and therefore affect the efficiency and operational parameters of the filter, were based on the use of non-standard, ultra precise custom components, and/or required a significant number of additional components. Consequently, the prior art “solutions” were, at best flawed work arounds that failed to effectively address the problem of gate current discussed above. Therefore, in the prior art, either the gate oxide layer thickness was increased, a very costly and undesirable option, or gate current was simply assumed and designed around.

What is needed is a method and apparatus for compensating for gate current that does not significantly change the characteristics of the capacitor, uses standard components, requires a minimal number of additional components and is fully independent of process, supply voltage and temperature variations.

SUMMARY OF THE INVENTION

The present invention is directed to a method and apparatus for compensating for gate current through a capacitor. According to the invention, a first capacitor, in one embodiment of the invention a PMOS device configured as a capacitor, has a parasitic DC gate current “Ig”. According to the present invention, gate current Ig is compensated for by a compensation circuit.

In one embodiment of the invention, the compensation circuit includes: a biasing circuit; a first compensation transistor; a second compensation transistor; and a compensation capacitor, in one embodiment of the invention a PMOS device configured as a compensation capacitor.

According to the invention, one purpose of the biasing circuit is to ensure the bias voltage across the compensation capacitor is equal to the bias voltage across the first capacitor. Since, according to the method and apparatus of the present invention, the bias voltages of the first capacitor and the compensation capacitor are kept the same, the gate current Ig of the first capacitor is proportional to the area of the first capacitor and the gate current of the compensation capacitor is proportional to the area of the compensation capacitor.

In addition, according to the invention, the size of the second compensation transistor is chosen such that if, the ratio of the area of the compensation capacitor divided by the area of the first capacitor is area ratio “AR”, then, the ratio of the size of first compensation transistor divided by the size of second compensation transistor is also area ratio “AR”.

According to the invention, when: the first capacitor; the compensation capacitor; the first compensation transistor; and the second compensation transistor are chosen to have the same area ratio “AR” as defined above, then, the gate current Ig, through the first capacitor is equal to the gate current through the compensation capacitor divided by the area ratio “AR” and current through the second compensation transistor is equal to the current through first compensation transistor divided by the area ratio "AR". Consequently, according to the method and apparatus of the present invention, the gate current Ig through the first capacitor is equal to the current drained off through the second compensation transistor. Therefore, the potentially adverse effects of the gate current Ig through the first capacitor are neutralized by the current drained off through second compensation transistor.

Using the method and apparatus of the present invention, gate current is compensated for without changing the characteristics of the capacitor and by using standard components. In addition, the method and apparatus of the present invention requires a minimal number of additional components and is fully independent of process, supply voltage and temperature variations.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1A:
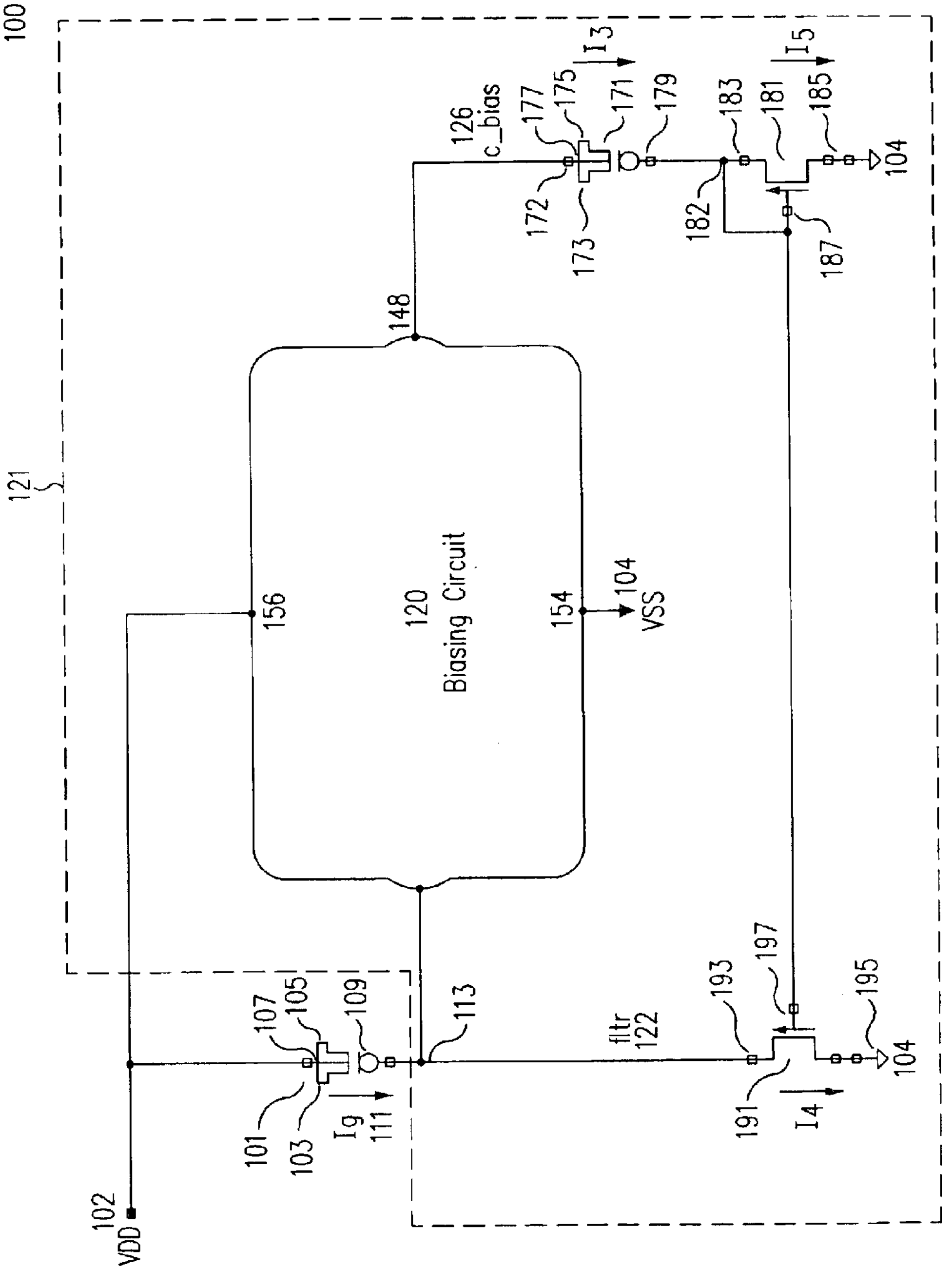
FIG. 1A is a schematic, diagram of a compensation circuit designed according to the invention coupled to a PMOS capacitor according to the principles of the present invention.
Figure 1B:
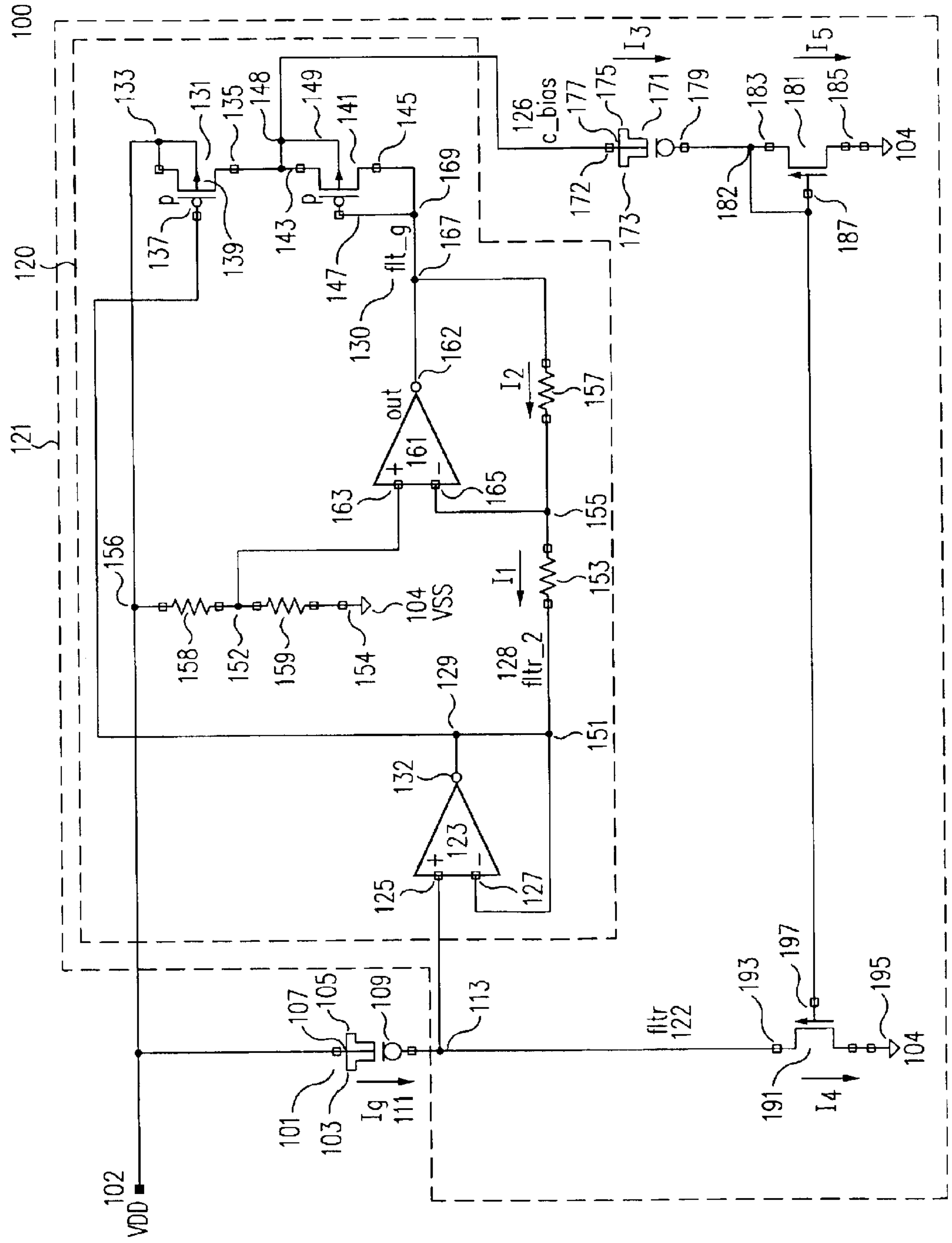
FIG. 1B is a schematic diagram of a compensation circuit, including a specific embodiment of a biasing circuit, coupled to a PMOS capacitor according to the principles of the present invention.

The present invention is directed to a method and apparatus for compensating for gate current (Ig in FIG. 1A and FIG. 1B) through a capacitor (101 in FIG. 1A and FIG. 1B). According to the invention, a capacitor (101 in FIG. 1A and FIG. 1B), in one embodiment of the invention a PMOS device configured as capacitor, has a parasitic DC gate current "Ig". According to the present invention, the gate current Ig is compensated for by a compensation circuit (121 in FIG. 1A and FIG. 1B).

In one embodiment of the invention, the compensation circuit includes: a biasing circuit (120 in FIG. 1A and FIG. 1B); a first compensation transistor (181 in FIG. 1A and FIG. 1B); a second compensation transistor (191 in FIG. 1A and FIG. 1B); and a compensation capacitor (171 in FIG. 1A and FIG. 1B), in one embodiment of the invention a PMOS device configured as a compensation capacitor (171 in FIG. 1A and FIG. 1B).

According to the invention, one purpose of the biasing circuit is to ensure the bias voltage across the compensation capacitor is equal to the bias voltage across the first capacitor. Since, according to the method and apparatus of the present invention, the bias voltages of the first capacitor and the compensation capacitor are kept the same, the gate current Ig of the first capacitor is proportional to the area of the first capacitor and the gate current (I3 in FIG. 1A and FIG. 1B) of the compensation capacitor is proportional to the area of the compensation capacitor.

In addition, according to the invention, the size of the second compensation transistor (191 in FIG. 1A and FIG. 1B) is chosen such that if, the ratio of the area of the compensation capacitor divided by the area of the first capacitor is area ratio "AR", then, the ratio of the size of first compensation transistor (181 in FIG. 1A and FIG. 1B) divided by the size of second compensation transistor (191 in FIG. 1A and FIG. 1B)is also area ratio "AR".

According to the invention, when: the first capacitor; the compensation capacitor; the first compensation transistor; and the second compensation transistor are chosen to have the same area ratio "AR" as defined above, then, the gate current Ig, through the first capacitor is equal to the gate current through the compensation capacitor divided by the area ratio "AR" and current through the second compensation transistor (I4 in FIG. 1A and FIG. 1B) is equal to the current through the first compensation transistor (I5 in FIG. 1A and FIG. 1B) divided by the area ratio "AR". Consequently, according to the method and apparatus of the present invention, the gate current Ig through the first capacitor is equal to the current drained off through second compensation transistor (I4 in FIG. 1A and FIG. 1B). Therefore, the potentially adverse effects of the gate current Ig through the first capacitor are neutralized by the current drained off through second compensation transistor.

Using the method and apparatus of the present invention, gate current is compensated for without changing the characteristics of the capacitor and by using standard components. In addition, the method and apparatus of the present invention requires a minimal number of additional components and is fully independent of process, supply voltage and temperature variations.

FIG. 1A is a schematic diagram of a compensation circuit 121 designed according to the invention coupled to a capacitor 101, also referred to herein as first capacitor 101, according to the principles of the present invention.

As shown in FIG. 1A, capacitor 101 includes: a source, or first electrode, 103; a drain, or second electrode, 105; an N-well tie, or bias electrode, 107; and a gate, or control electrode, 109.

The configuration for making a PMOS device into capacitor 101 shown in FIG. 1A is to connect source 103 and drain 105, also collectively called diffusions 103 and 105 in this configuration, and N-well tie 107 to a first supply voltage 102, typically Vdd. Gate 109 is then connected to the desired first node 113, also referred to herein as first node 113, which is typically coupled to other devices such as a filter in a Phase-Locked-Loop (PLL) application (not shown). Typically, first node 113 has a more negative potential on it than the potential on source 103 and drain 105, i.e., the diffusions 103 and 105.

As discussed above, in the configuration of a PMOS device as capacitor 101, there is a parasitic DC gate current Ig flowing from source 103 and drain 105, i.e., diffusions 103 and 105, through the oxide layer (not shown) of gate 109 to gate 109 and first node 113 along path 111. As also discussed above, in the prior art, the thickness of the oxide or poly layer making up gate 109 was large enough that gate current Ig was minimal and considered negligible and, therefore, was often ignored, however, the thickness of gate oxide layers has been steadily decreasing. Consequently, the ability of the gate oxide layer to insulate, and thereby keep gate current Ig minimal, is constantly decreasing and gate current Ig is no longer considered negligible.

As also discussed above, gate current Ig may vary as an exponential function of the voltage between gate 109 and source 103 (Vgs) and, when a PMOS device is configured as capacitor 101, i.e., gate 109 is used as a capacitor, it is particularly difficult to compensate for gate current Ig because gate 109 must remain a "floating node" for an extended period of time and therefore cannot be driven by any external voltage source to create a corrective biasing Vgs.

According to the present invention, gate current Ig is compensated for by compensation circuit 121. As seen in FIG. 1A, compensation circuit 121 includes: biasing circuit 120; first compensation transistor 181; second compensation transistor 191; and a second PMOS device configured as compensation capacitor 171.

According to one embodiment of the invention, first supply voltage 102, typically Vdd, is coupled to input fifth node 156 of biasing circuit 120 and second supply voltage 104, typically Vss, is coupled to input sixth node 154 of biasing circuit 120. In addition, input node 125 of biasing circuit 120 is coupled to first node 113 and output 148 of biasing circuit 120 is coupled to node 172 and compensation capacitor 171.

Compensation capacitor 171, like capacitor 101, is, in one embodiment of the invention, a PMOS device with a first flow electrode or source 173, a second flow electrode or drain 175, and a bias electrode or N-well tie 177 coupled together and all coupled to second node 172. According to one embodiment of the invention, compensation capacitor 171 is specifically chosen so that the ratio of the width of the PMOS device making up compensation capacitor 171 divided by the length of the PMOS device making up compensation capacitor 171, i.e., the area of the PMOS device making up compensation capacitor 171 is equal to one tenth the ratio of the width of the PMOS device making up capacitor 101 divided by the length of the PMOS device making up capacitor 101, i.e.,. the area of the PMOS device making up compensation capacitor 101. Consequently, since the gate current of a PMOS device configured as a capacitor is proportional to the area of the PMOS device, the gate current from source 173 and drain 175 to gate 179 of compensation capacitor 171 is one tenth the gate current from source 103 and drain 105 to gate 109 of capacitor 101, provided the bias voltages of capacitor 101 and compensation capacitor 171 are the same.

According to the invention, one purpose of biasing circuit 120 is to ensure the bias voltage across compensation capacitor 171 (VC171) is equal to the bias voltage across capacitor 101 (VC101). One specific embodiment of a biasing circuit 120 providing this function is discussed below with respect to FIG. 1B, however, those of skill in the art will readily recognize that this function can be accomplished using a wide variety of biasing circuits 120. Consequently, the present invention should not be read as being limited to the one embodiment of a biasing circuit 120 shown in FIG. 1B, used strictly for exemplary purposes.

Since, according to the method and apparatus of the present invention, the bias voltages of capacitor 101 and compensation capacitor 171 are the kept same, the gate current Ig of the PMOS device configured as capacitor 101 is proportional to the area of the PMOS device making up capacitor 101 and the gate current I3 of the PMOS device configured as compensation capacitor 171 is proportional to the area of the PMOS device making up compensation capacitor 171.

Therefore, when, as according to the one embodiment of the invention discussed above, compensation capacitor 171 is specifically chosen so the ratio of the width of the PMOS device making up compensation capacitor 171 divided by the length of the PMOS device making up compensation capacitor 171 is equal to one tenth the ratio of the width of the PMOS device making up capacitor 101 divided by the length of the PMOS device making up capacitor 101, gate current I3 from source 173 and drain 175 to gate 179 of compensation capacitor 171 is one tenth gate current Ig from source 103 and drain 105 to gate 109 of capacitor 101.

In addition, according to the invention, the size of second compensation transistor 191 is chosen such that the ratio of the size of first compensation transistor 181 divided by the size of second compensation transistor 191 is equal to the ratio of the width of the PMOS device making up compensation capacitor 171 divided by the length of the PMOS device making up compensation capacitor 171 divided by the ratio of the width of the PMOS device making up capacitor 101 divided by the length of the PMOS device making up capacitor 101. In other words, according to the present invention, if, the ratio of the area of the PMOS device making up compensation capacitor 171 divided by the area of the PMOS device making up capacitor 101 is area ratio "AR", then, the size of second compensation transistor 191 is chosen such that the ratio of the size of first compensation transistor 181 divided by the size of second compensation transistor 191 is also area ratio "AR".

Therefore, when, as according to the one embodiment of the invention discussed above, compensation capacitor 171 is specifically chosen so the ratio of the width of the PMOS device making up compensation capacitor 171 divided by the length of the PMOS device making up compensation capacitor 171 is equal to one tenth the ratio of the width of the PMOS device making up capacitor 101 divided by the length of the PMOS device making up capacitor 101, i.e., area ratio "AR" is equal to one-tenth ($1/10$), then, the size of second compensation transistor 191 is chosen such that the ratio of the size of first compensation transistor 181 divided by the size of second compensation transistor 191 is also the area ratio one-tenth ($1/10$).

When capacitor 101, compensation capacitor 171, first compensation transistor 181 and second compensation transistor 191 are chosen to have the same area ratios "AR" as defined above, then, gate current Ig, through capacitor 101 is equal to gate current I3 through compensation capacitor 171 divided by the area ratio "AR" and current I4 through second compensation capacitor 191 is equal to current I5 through first compensation transistor 181 divided by the area ratio "AR". However, current I5 through first compensation transistor 181 is equal to gate current I3 through compensation capacitor 171. Therefore, current I4 is equal to gate current I3 divided by the area ratio "AR" and gate current Ig through capacitor 101 is equal to I3 divided by the area ratio "AR" so that gate current Ig through capacitor 101 is equal to the current I4 through second compensation transistor 191. The relationship below summarizes the above discussion:

Ig=I3/AR;

I4=I5/AR

I5=I3;

I4=I3/AR;

I4=Ig

Consequently, according to the method and apparatus of the present invention, gate current Ig through capacitor 101 is equal to the current I4 drained off through second compensation transistor 191. Therefore, the potentially adverse effects of gate current Ig are neutralized by I4.

As discussed above, using the method and apparatus of the present invention shown in FIG. 1A, gate current is compensated for without changing the characteristics of the capacitor and by using standard components. In addition, the method and apparatus of the present invention requires a minimal number of additional components and is fully independent of process, supply voltage and temperature variations.

FIG. 1B is a schematic diagram of compensation circuit 121 of FIG. 1B, including a specific embodiment of a biasing circuit 120, coupled to a PMOS device configured as capacitor 101, also referred to herein as first capacitor 101, according to the principles of the present invention. As shown in FIG. 1B, and as shown in FIG. 1A, capacitor 101 includes: source, or first electrode, 103; drain, or second electrode, 105; N-well tie, or bias electrode, 107; and gate, or control electrode, 109.

As discussed above, the configuration for making the PMOS device into capacitor 101 shown in FIG. 1B is to connect source 103 and drain 105, also collectively called diffusions 103 and 105 in this configuration, and N-well tie 107 to a first supply voltage 102, typically Vdd. Gate 109 is then connected to the desired node 113, also referred to herein as first node 113, which is typically coupled to other devices such as a filter in a Phase-Locked-Loop (PLL) application (not shown). Typically, but not necessarily, first node 113 has a more negative potential on it than the potential on source 103 and drain 105, i.e., the diffusions 103 and 105.

As discussed above, in the configuration of a PMOS device as capacitor 101, there is parasitic DC gate current Ig flowing from source 103 and drain 105, i.e., diffusions 103 and 105, through the oxide layer (not shown) of gate 109 to gate 109 and first node 113 along path 111. As also discussed above, in the prior art, the thickness of the oxide or poly layer making up gate 109 was large enough that gate current Ig was minimal and considered negligible and, therefore, was often ignored, however, to accommodate smaller feature sizes, faster clock speeds and advances in low power circuits, the thickness of gate oxide layers have been steadily decreasing. Consequently, the ability of the gate oxide layer to insulate, and thereby keep gate current Ig minimal, is constantly decreasing and gate current Ig can no longer be, and no longer is, considered negligible.

As also discussed above, unfortunately, gate current Ig may vary as an exponential function of the voltage between gate 109 and source 103 (Vgs) and, when a PMOS device is configured as capacitor 101, i.e., gate 109 is used as a capacitor, it is particularly difficult to compensate for gate current because gate 109 must remain a "floating node" for an extended period of time and therefore cannot be driven by any external voltage source to create a corrective biasing Vgs.

According to the present invention, gate current Ig is compensated for by compensation circuit 121. As seen in FIG. 1B, compensation circuit 121 includes biasing circuit 120. In the one embodiment of the invention shown in FIG. 1B, biasing circuit 120 includes: first operational amplifier 123 (first opamp 123); second operational amplifier 161 (second opamp 161); resistor 158; resistor 159; resistor 153; resistor 157; first biasing transistor 131; and second biasing transistor 141.

As seen in FIG. 1B, and as discussed above with respect to FIG. 1A, in addition to biasing circuit 120, compensation circuit 121 also includes: first compensation transistor 181; second compensation transistor 191; and a second PMOS device configured as compensation capacitor 171.

According to the invention, first input 125 of first opamp 123 is coupled to first node 113 and is therefore at potential fltr 122. Second input 127 of first opamp 123 is coupled to third node 151 and therefore is at potential fltr_2 128. Output 132 of first opamp 123 is then coupled to fourth node 129 so that first opamp 123 insures that voltage fltr_2 128 is the mirror image of voltage fltr 122. In addition, first supply voltage 102, typically Vdd, is coupled to fifth node 156 and resistor 158 and second supply voltage 104, typically Vss, is coupled to sixth node 154 of resistor 159. According to the invention, resistors 158 and 159 are of equal resistance and therefore form a first voltage divider so that the voltage at seventh node 152 is one half of first supply voltage 102, i.e., one-half Vdd. As a result, the voltage at first input node 163 of second opamp 161 equals the voltage at node 163, which is one-half Vdd. In addition, third node 151 is coupled to resistor 153 so that the voltage on resistor 153 is fltr_2 128. According to the invention, resistors 153 and 157 are of equal resistance so that resistors 153 and 157 from a second voltage divider and the voltage at second input 165 of second opamp 161 equals the voltage at node 163, which is one-half Vdd. Since according to the invention, resistors 153 and 157 are of equal resistance, no current flows to second input 165 of second opamp 161 and the current I1 through resistor 153 and the current I2 through resistor 157 are equal. In addition, according to the invention, a voltage fltr_g 130 is present at output 162 of second opamp 161.

Consequently, according to the invention, fltr_g 130 minus the voltage at eighth node 155 (V155) is equal to V155 minus fltr_2 128. Since fltr_2 128 is equal to fltr 122, then fltr_g 130 minus V155 is equal to V155 minus fltr 122. Therefore, fltr_g 130 is equal to twice V155 minus fltr 122. However, V155 is also equal to the voltage at seventh node 152 (V152) that is one-half first supply voltage 102, (Vdd). Consequently, 2V155 is equal to Vdd 102 and fltr_g 130 is therefore equal to Vdd 102 minus fltr 122. This relationship is summarized as follows:

fltr_g 130−V155=V155−fltr_2 128;

fltr_2 128=fltr 122;

fltr_g 130−V155=V155−fltr 122;

fltr_g=2V155−fltr 122;

V155=V152=½ Vdd 102;

2V155=Vdd 102;

fltr_g 130=Vdd 102−fltr 122.

Consequently, fltr 122 can be seen as referenced to Vdd while fltr_g 130 can be seen as referenced to second supply voltage 104 or ground and fltr_g minus ground 104 is equal to Vdd 102 minus fltr 122.

As shown in FIG. 1B, according to the invention, ninth node 167 and fltr_g 130 is coupled to a gate 147 of second biasing transistor 141. Second biasing transistor 141 is configured as a diode, i.e., second flow electrode or drain 145 is coupled to gate 147 and fltr_g 130. Consequently, the voltage drop across second biasing transistor 141, i.e., between nodes 169 and 148, is equal to-the threshold voltage of second biasing transistor 141, or the threshold voltage of a P-transistor. First flow electrode or source 143 of second biasing transistor 141 is coupled to a second flow electrode or drain 135 of first biasing transistor 131. First biasing transistor 131 includes: a first flow electrode or source 133 coupled to first supply voltage 102; a control electrode or gate 137 coupled to fourth node 129 and fltr_2 128; and a bias electrode or N-well tie 131 coupled to source 133. According to the invention, first biasing transistor 131 is used primarily as a variable resistor to develop the threshold voltage of second biasing transistor 141 at source 143 of second biasing transistor 141. Source 143 of second biasing transistor 141 is also coupled a bias electrode or N-well tie of second biasing transistor 141 and second node 172, which is coupled to compensation capacitor 171, to provide the voltage C_bias 126.

Compensation capacitor 171, like capacitor 101, is, in one embodiment of the invention, a PMOS device with a first flow electrode or source 173, a second flow electrode or drain 175, and a bias electrode or N-well tie 177 coupled together and all coupled to second node 172. According to one embodiment of the invention, compensation capacitor 171 is specifically chosen so that the ratio of the width of the PMOS device making up compensation capacitor 171 divided by the length of the PMOS device making up compensation capacitor 171 is equal to one tenth the ratio of the width of the PMOS device making up capacitor 101 divided by the length of the PMOS device making up capacitor 101. Consequently, since the gate current of a PMOS device configured as a capacitor is proportional to the area of the PMOS device, the gate current I3 from source 173 and drain 175 to gate 179 of compensation capacitor 171 is one tenth the gate current Ig from source 103 and drain 105 to gate 109 of capacitor 101, provided the bias voltages of capacitor 101 and compensation capacitor 171 are the same.

The following discussion will show how, according to the one specific embodiment of the invention shown in FIG. 1B, the bias voltages of capacitor 101 and compensation capacitor 171 are the kept same. According to the invention, the PMOS devices, i.e., first biasing transistor 131 and second biasing transistor 141, and NMOS devices, i.e., first compensation transistor 181 and second compensation transistor 191, are designed, by methods well known to those of skill in the art, such that the threshold voltages of transistors 131, 141, 181, and 191 are the same. Consequently, according to the invention, the voltage drop across first compensation transistor 181 between tenth node 182 and second supply voltage 104, i.e., the threshold voltage of an NMOS device (VTHN), and the voltage drop across second biasing transistor 141 between eleventh node 169 and twelfth node 148, i.e., the threshold voltage of a P-transistor (VTHP) are equal.

According to the invention, C_bias 126 is equal to fltr_g 130 plus the threshold voltage of second biasing transistor 141 (VTH141). VTH141 is equal to VTHP, which, as explained above, according to the invention, is equal to VTHN. Consequently, C_bias 126 is equal to fltr_g 130 plus VTHN. The bias voltage of compensation capacitor 171 (VC171) is equal to C_bias 126 minus the threshold voltage of first compensation transistor 181 (VTH181). VTH181 is equal to VTHN. Consequently, VC171 is equal to C_bias 126 minus VTHN. Since, as discussed above, C_bias 126 is equal to fltr_g 130 plus VTHN, VC171 is equal to fltr_g 130 plus VTHN minus VTHN or; VC171 is equal to fltr_g 130. As discussed above, fltr_g 130 is equal to Vdd 102 minus fltr 122, which is the bias voltage across capacitor 101. Consequently, according to the invention, the bias voltage across compensation capacitor 171 (VC171) is equal to the bias voltage across capacitor 101 (VC101). Summarizing the relationships discussed above, and combining with our earlier discussion, the result is:

fltr_g 130−V155=V155−fltr_2 128;

fltr_2 128=fltr 122;

fltr_g 130−V155=V155−fltr 122;

fltr_g=2V155−fltr 122;

V155=V152=½ Vdd 102;

2V155=Vdd 102;

fltr_g 130=Vdd 102−fltr 122;

C_bias 126=fltr_g 130+VTH141;

VTH141=VTHP=VTHN;

C_bias 126=fltr_g 130+VTHN;

VC171=C_bias 126−VTH181;

VTH181=VTHN;

VC171=C_bias 126−VTHN;

C_bias 126=fltr_g 130+VTHN;

VC171=fltr_g 130+VTHN−VTHN;

VC171=fltr_g 130;

fltr_g 130=Vdd 102−fltr 122=VC101

VC171=VC101.

As shown above, using the method and apparatus of the present invention, the bias voltages of capacitor 101 and compensation capacitor 171 are the kept same. Consequently, the gate current Ig of the PMOS device configured as a capacitor 101 is proportional to the area of the PMOS device making up capacitor 101 and the gate current I3 of the PMOS device configured as a compensation capacitor 171 is proportional to the area of the PMOS device making up compensation capacitor 171. Therefore, when, as according to the one embodiment of the invention discussed above, compensation capacitor 171 is specifically chosen so the ratio of the width of the PMOS device making up compensation capacitor 171 divided by the length of the PMOS device making up compensation capacitor 171 is equal to one tenth the ratio of the width of the PMOS device making up capacitor 101 divided by the length of the PMOS device making up capacitor 101, gate current I3 from source 173 and drain 175 to gate 179 of compensation capacitor 171 is one tenth gate current Ig from source 103 and drain 105 to gate 109 of capacitor 101.

In addition, according to the invention, the size of second compensation transistor 191 is chosen such that the ratio of the size of first compensation transistor 181 divided by the size of second compensation transistor 191 is equal to the ratio of the width of the PMOS device making up compensation capacitor 171 divided by the length of the PMOS device making up compensation capacitor 171 divided by the ratio of the width of the PMOS device making up capacitor 101 divided by the length of the PMOS device making up capacitor 101. In other words, according to the present invention, if, the ratio of the area of the PMOS device making up compensation capacitor 171 divided by the area of the of the PMOS device making up capacitor 101 is area ratio "AR", then, the size of second compensation transistor 191 is chosen such that the ratio of the size of first compensation transistor 181 divided by the size of second compensation transistor 191 is also area ratio "AR".

Therefore, when, as according to the one embodiment of the invention discussed above, compensation capacitor 171 is specifically chosen so the ratio of the width of the PMOS device making up compensation capacitor 171 divided by the length of the PMOS device making up compensation capacitor 171 is equal to one tenth the ratio of the width of the PMOS device making up capacitor 101 divided by the length of the PMOS device making up capacitor 101, i.e., area ratio "AR" is equal to one-tenth (1/10), then, the size of second compensation transistor 191 is chosen such that the ratio of the size of first compensation transistor 181 divided by the size of second compensation transistor 191 is also area ratio onetenth (1/10).

When capacitor 101, compensation capacitor 171, first compensation transistor 181 and second compensation transistor 191 are chosen to have the same area ratios "AR" as defined above, then, gate current Ig, through capacitor 101 is equal to gate current I3 through compensation capacitor 171 divided by the area ratio "AR" and current I4 through second compensation capacitor 191 is equal to current I5 through first compensation transistor 181 divided by the area ratio "AR". However, current I5 through first compensation transistor 181 is equal to gate current I3 through compensation capacitor 171. Therefore, current I4 is equal to gate current I3 divided by the area ratio "AR" and gate current Ig through capacitor 101 is equal to I3 divided by the area ratio "AR" so that gate current Ig through capacitor 101 is equal to the current I4 through second compensation transistor 191. The relationship below summarizes the above discussion:

Ig=I3/AR;

I4=I5/AR

I5=I3;

I4=I3/AR;

I4=Ig

Consequently, according to the method and apparatus of the present invention, gate current Ig through capacitor 101 is equal to the current I4 drained off through second compensation transistor 191. Therefore, the potentially adverse effects of gate current Ig are neutralized by I4.

In addition, according to the method and apparatus of the present invention, first biasing transistor 131 works as a variable resistor with a resistance proportional to fltr__2 128. Consequently, when fltr__2 128 is minimum, i.e., approximately zero volts, the resistance provided by first biasing transistor 131 is minimum. This is optimal because when fltr__2 128 is minimum is also the time when Ig is largest and it is desirable to have maximum current through first biasing transistor 131 so that the ratio of the current through second biasing transistor 141 and I3 is maximized. The purpose of first biasing transistor 131 in this instance is to minimize the current loading effect of gate current I3 through compensation capacitor 171 on the current used for developing the threshold voltage VTH141 of second biasing transistor 141. According to the embodiment of the invention shown in FIG. 1B, the threshold voltage on compensation capacitor 171 will be maximized to match the threshold voltage VTH181 of first compensation transistor 181. This also helps to pull C__bias 126 to first supply voltage 102, i.e., Vdd, to develop maximum bias on compensation capacitor 171.

Conversely, when fltr__2 128 is maximum, i.e., approximately Vdd, the resistance provided by first biasing transistor 131 is maximum. This too is optimal because when fltr__2 128 is maximum is also the time when Ig is smallest and it is desirable to have minimum current through first biasing transistor 131 so that the current through second biasing transistor 141 will be minimized to match the threshold voltage VTH181 of first compensation transistor 181. This also helps to pull C__bias 126 low to develop minimum bias on compensation capacitor 171. Consequently, the effectiveness of second biasing transistor 141 is significantly enhanced by first biasing transistor 131 acting as a variable resistor with a resistance proportional to fltr__2 128.

As discussed above, using the method and apparatus of the present invention, gate current is compensated for without changing the characteristics of the capacitor and by using standard components. In addition, the method and apparatus of the present invention requires a minimal number of additional components and is fully independent of process, supply voltage and temperature variations.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, one specific embodiment of a biasing circuit 120 providing the required function is discussed above with respect to FIG. 1B, however, those of skill in the art will readily recognize that this function can be accomplished using a wide variety of circuits. Consequently, the present invention should not be read as being limited to the one embodiment of a biasing circuit 120 shown in FIG. 1B, used strictly for exemplary purposes.

Also, those of skill in the art will readily recognize that the one embodiment of compensation circuit 121, including a PMOS device configured as compensation capacitor 171 that is one tenth the size of the PMOS device configured as capacitor 101 was discussed above for exemplary purposes only and that other ratios for the sizes of the PMOS device configured as compensation capacitor 171 and the PMOS device configured as capacitor 101 can be used, including, but not limited to, same size devices, to meet the needs of the designer. The only requirement, according to the invention, is that if, the ratio of the width of the PMOS device making up compensation capacitor 171 divided by the length of the PMOS device making up compensation capacitor 171 divided by the ratio of the width of the PMOS device making up capacitor 101 divided by the length of the PMOS device making up capacitor 101 is area ratio "AR", then, the size of second compensation transistor 191 is chosen such that the ratio of the size of first compensation transistor 181 divided by the size of second compensation transistor 191 is also area ratio "AR".

In addition, those of skill in the art will readily recognize that the use of PMOS devices configured as capacitor 101 and compensation capacitor 171 was shown merely for exemplary purposes and to show a likely structure using known techniques. However, capacitor 101 and compensation capacitor 171 can be, in other embodiments of the invention, traditional capacitors. In addition, in other embodiments of the invention, either one of capacitor 101 or compensation capacitor 171 can be PMOS devices while the other of capacitor 101 or compensation capacitor 171 is a traditional capacitor. As discussed above, the only requirement, according to the invention, is that if the ratio of the area of compensation capacitor 171 divided by the area of capacitor 101 is area ratio "AR", then, the size of second compensation transistor 191 is chosen such that the ratio of the size of first compensation transistor 181 divided by the size of second compensation transistor 191 is also area ratio "AR".

Consequently, the scope of the invention is defined by the claims and their equivalents.

What is claimed is:

1. A compensation circuit coupled to a first capacitor, said compensation circuit comprising:

a first supply voltage, said first supply voltage being coupled to said first capacitor;

a second supply voltage;

a first node, said first node being coupled to said first capacitor;

a compensation capacitor;

a first compensation transistor, said first compensation transistor having a first compensation transistor first flow electrode, a first compensation transistor second flow electrode and a first compensation transistor control electrode, said first compensation transistor first flow electrode being coupled to said compensation capacitor, said first compensation transistor second flow electrode being coupled to said second supply voltage;

a second compensation transistor, said second compensation transistor having a second compensation transistor first flow electrode, a second compensation transistor second flow electrode and a second compensation transistor control electrode, said second compensation transistor first flow electrode being coupled to said first capacitor, said second compensation transistor second flow electrode being coupled to said second supply voltage, said second compensation transistor control electrode being coupled to said first compensation transistor control electrode; and a biasing circuit, said biasing circuit having a first input coupled to said first supply voltage, said biasing circuit having a second input coupled to said second supply voltage, said biasing circuit having a third input coupled to said first node and said second compensation transistor first flow electrode, said biasing circuit having an output coupled to said compensation capacitor, wherein said biasing circuit is configured such that a bias voltage across said compensation capacitor is equal to a bias voltage across said first capacitor, further wherein a ratio of the area of said compensation capacitor divided by the area of said first capacitor is equal to a ratio of the size of said first compensation transistor divided by the size of said second compensation transistor such that a gate current through said first capacitor is equal a current through said second compensation transistor; and further wherein said compensation capacitor is coupled in series with the first compensation transistor.

2. The compensation circuit of claim 1, further wherein ratio of the area of said compensation capacitor divided by the area of said first capacitor and said ratio of the size of said first compensation transistor divided by the size of said second compensation transistor is equal to one-tenth.

3. The compensation circuit of claim 1, further wherein said ratio of the area of said compensation capacitor divided by the area of said first capacitor and said ratio of the size of said first compensation transistor divided by the size of said second compensation transistor is equal to one.

4. The compensation circuit of claim 1, further wherein said first capacitor is a first PMOS transistor configured as a capacitor, said first PMOS transistor having a first PMOS transistor first flow electrode, a first PMOS transistor second flow electrode, a first PMOS transistor control electrode, and a first PMOS transistor biasing electrode, said first PMOS transistor first flow electrode being coupled to said first PMOS transistor second flow electrode, said first PMOS transistor biasing electrode and said first supply voltage, said first PMOS transistor control electrode being coupled to said first node and said third input of said biasing circuit.

5. The compensation circuit of claim 4, further wherein said compensation capacitor is a compensation PMOS transistor configured as a capacitor, said compensation PMOS transistor having a compensation PMOS transistor first flow electrode, a compensation PMOS transistor second flow electrode, a compensation PMOS transistor control electrode, and a compensation PMOS transistor biasing electrode, said compensation PMOS transistor first flow electrode being coupled to said compensation PMOS transistor second flow electrode, said compensation PMOS transistor biasing electrode and said output of said biasing circuit, said compensation PMOS transistor control electrode being coupled to said second compensation transistor first flow electrode.

6. The compensation circuit of claim 1, further wherein said first capacitor is a first PMOS transistor configured as a capacitor, said first PMOS transistor having a first PMOS transistor first flow electrode, a first PMOS transistor second flow electrode, a first PMOS transistor control electrode, and a first PMOS transistor biasing electrode, said first PMOS transistor first flow electrode being coupled to said first PMOS transistor second flow electrode, said first PMOS transistor biasing electrode and said first supply voltage, said first PMOS transistor control electrode being coupled to said first node and said third input of said biasing circuit; and said compensation capacitor is a compensation PMOS transistor configured as a capacitor, said compensation PMOS transistor having a compensation PMOS transistor first flow electrode, a compensation PMOS transistor second flow electrode, a compensation PMOS transistor control electrode, and a compensation PMOS transistor biasing electrode, said compensation PMOS transistor first flow electrode being coupled to said compensation PMOS transistor second flow electrode, said compensation PMOS transistor biasing electrode and said output of said biasing circuit, said compensation PMOS transistor control electrode being coupled to said second compensation transistor first flow electrode.

7. The compensation circuit of claim 6, further wherein said ratio of the area of said compensation capacitor divided by the area of said first capacitor and said ratio of the size of said first compensation transistor divided by the size of said second compensation transistor is equal to one-tenth.

8. The compensation circuit of claim 6, further wherein said ratio of the area of said compensation capacitor divided by the area of said first capacitor and said ratio of the size of said first compensation transistor divided by the size of said second compensation transistor is equal to one.

9. The compensation circuit of claim 6, further wherein said first supply voltage is Vdd and said second supply voltage is Vss.

10. The compensation circuit of claim 9, further wherein said first compensation transistor is an NMOS transistor; and said second compensation transistor is an NMOS transistor.

11. The compensation circuit of claim 10, further wherein said ratio of the area of said compensation capacitor divided by the area of said first capacitor and said ratio of the size of said first compensation transistor divided by the size of said second compensation transistor is equal to one-tenth.

12. The compensation circuit of claim 10, further wherein said ratio of the area of said compensation capacitor divided by the area of said first capacitor and said ratio of the size of said first compensation transistor divided by the size of said second compensation transistor is equal to one.

13. A compensation circuit coupled to a first capacitor, said compensation circuit comprising:

a first supply voltage, Vdd, said first supply voltage being coupled to said first capacitor;

a second supply voltage, Vss;

a first node, said first node being coupled to said first capacitor;

a compensation capacitor;

a first compensation NMOS transistor, said first compensation NMOS transistor having a first compensation NMOS transistor first flow electrode, a first compensation NMOS transistor second flow electrode and a first compensation NMOS transistor control electrode, said first compensation NMOS transistor first flow electrode being coupled to said compensation capacitor, said first compensation NMOS transistor second flow electrode being coupled to said second supply voltage;

a second compensation NMOS transistor, said second compensation NMOS transistor having a second compensation NMOS transistor first flow electrode, a second compensation NMOS transistor second flow electrode and a second compensation NMOS transistor control electrode, said second compensation NMOS transistor first flow electrode being coupled to said first capacitor, said second compensation NMOS transistor second flow electrode being coupled to said second supply voltage, said second compensation NMOS transistor control electrode being coupled to said first compensation NMOS transistor control electrode; and a biasing circuit, said biasing circuit having a first input coupled to said first supply voltage, said biasing circuit having a second input coupled to said second supply voltage, said biasing circuit having a third input coupled to said first node and said second compensation NMOS transistor first flow electrode, said biasing circuit having an output coupled to said compensation capacitor, wherein said biasing circuit is configured such that a bias voltage across said compensation capacitor is equal to a bias voltage across said first capacitor, further wherein a ratio of the area of said compensation capacitor divided by the area of said first capacitor is equal to a ratio of the size of said first compensation NMOS transistor divided by the size of said second compensation NMOS transistor such that a gate current through said first capacitor is equal a current through said second compensation NMOS transistor, further wherein said first capacitor is a first PMOS transistor configured as a capacitor, said first PMOS transistor having a first PMOS transistor first flow electrode, a first PMOS transistor second flow electrode, a first PMOS transistor control electrode, and a first PMOS transistor biasing electrode, said first PMOS transistor first flow electrode being coupled to said first PMOS transistor second flow electrode, said first PMOS transistor biasing electrode and said first supply voltage, said first PMOS transistor control electrode being coupled to said first node and said third input of said biasing circuit, further wherein said compensation capacitor is a compensation PMOS transistor configured as a capacitor, said compensation PMOS transistor having a compensation PMOS transistor first flow electrode, a compensation PMOS transistor second flow electrode, a compensation PMOS transistor control electrode, and a compensation PMOS transistor biasing electrode, said compensation PMOS transistor first flow electrode being coupled to said compensation PMOS transistor second flow electrode, said compensation PMOS transistor biasing electrode and said output of said biasing circuit, said compensation PMOS transistor control electrode being coupled to said second compensation NMOS transistor first flow electrode, further wherein said ratio of the area of said compensation capacitor divided by the area of said first capacitor and said ratio of the size of said first compensation NMOS transistor divided by the size of said second compensation NMOS transistor is equal to one-tenth.

14. A compensation circuit coupled to a first capacitor, said compensation circuit comprising:

a first supply voltage, Vdd, said first supply voltage being coupled to said first capacitor;

a second supply voltage, Vss;

a first node, said first node being coupled to said first capacitor;

a compensation capacitor;

a first compensation NMOS transistor, said first compensation NMOS transistor having a first compensation NMOS transistor first flow electrode, a first compensation NMOS transistor second flow electrode and a first compensation NMOS transistor control electrode, said first compensation NMOS transistor first flow electrode being coupled to said compensation capacitor, said first compensation NMOS transistor second flow electrode being coupled to said second supply voltage;

a second compensation NMOS transistor, said second compensation NMOS transistor having a second compensation NMOS transistor first flow electrode, a second compensation NMOS transistor second flow electrode and a second compensation NMOS transistor control electrode, said second compensation NMOS transistor first flow electrode being coupled to said first capacitor, said second compensation NMOS transistor second flow electrode being coupled to said second supply voltage, said second compensation NMOS transistor control electrode being coupled to said first compensation NMOS transistor control electrode; and a biasing circuit, said biasing circuit having a first input coupled to said first supply voltage, said biasing circuit having a second input coupled to said second supply voltage, said biasing circuit having a third input coupled to said first node and said second compensation NMOS transistor first flow electrode, said biasing circuit having an output coupled to said compensation capacitor, wherein said biasing circuit is configured such that a bias voltage across said compensation capacitor is equal to a bias voltage across said first capacitor, further wherein a ratio of the area of said compensation capacitor divided by the area of said first capacitor is equal to a ratio of the size of said first compensation NMOS transistor divided by the size of said second compensation NMOS transistor such that a gate current through said first capacitor is equal a current through said second compensation NMOS transistor, further wherein said first capacitor is a first PMOS transistor configured as a capacitor, said first PMOS transistor having a first PMOS transistor first flow electrode, a first PMOS transistor second flow electrode, a first PMOS transistor control electrode, and a first PMOS transistor biasing electrode, said first PMOS transistor first flow electrode being coupled to said first PMOS transistor second flow electrode, said first PMOS transistor biasing electrode and said first supply voltage, said first PMOS transistor control electrode being coupled to said first node and said third input of said biasing circuit, further wherein said compensation capacitor is a compensation PMOS transistor configured as a capacitor, said compensation PMOS transistor having a compensation PMOS transistor first flow electrode, a compensation PMOS transistor second flow electrode, a compensation PMOS transistor control electrode, a compensation PMOS transistor biasing electrode, said compensation PMOS transistor first flow electrode being coupled to said compensation PMOS transistor second flow electrode, said compensation PMOS transistor biasing electrode and said output of said biasing circuit, said compensation PMOS transistor control electrode being coupled to said second compensation NMOS transistor first flow electrode, further wherein said ratio of the area of said compensation capacitor divided by the area of said first capacitor and said ratio of the size of said first compensation NMOS transistor divided by the size of said second compensation NMOS transistor is equal to one.

15. A method comprising:

providing a first capacitor providing a first supply voltage;

providing a second supply voltage;

coupling said first supply voltage to said first capacitor coupling a first node to said first capacitor;

providing a compensation capacitor;

providing a first compensation transistor, said first compensation transistor having a first compensation transistor first flow electrode, a first compensation transistor second flow electrode and a first compensation transistor control electrode;

coupling said first compensation transistor first flow electrode to said compensation capacitor;

coupling said first compensation transistor second flow electrode to said second supply voltage;

providing a second compensation transistor, said second compensation transistor having a second compensation transistor first flow electrode, a second compensation transistor second flow electrode and a second compensation transistor control electrode;

coupling said second compensation transistor first flow electrode to said first capacitor;

coupling said second compensation transistor second flow electrode to said second supply voltage;

coupling said second compensation transistor control electrode to said first compensation transistor control electrode;

providing a biasing circuit, said biasing circuit having a biasing circuit first input, a biasing circuit second input, a biasing circuit third input, and a biasing circuit output;

coupling said biasing circuit first input to said first supply voltage;

coupling said biasing circuit second input to said second supply voltage;

coupling said biasing circuit third input to said first node and said second compensation transistor first flow electrode;

coupling said biasing circuit output to said compensation capacitor; and configuring said biasing circuit such that a bias voltage across said compensation capacitor is equal to a bias voltage across said first capacitor, wherein said first capacitor, said compensation capacitor, said first compensation transistor, and said second compensation transistor are provided such that a ratio of the area of said compensation capacitor divided by the area of said first capacitor is equal to a ratio of the size of said first compensation transistor divided by the size of said second compensation transistor such that a gate current through said first capacitor is equal a current through said second compensation transistor; and further wherein said compensation capacitor is coupled in series with the first compensation transistor.

16. The method of claim 15, further wherein said ratio of the area of said compensation capacitor divided by the area of said first capacitor and said ratio of the size of said first compensation transistor divided by the size of said second compensation transistor is equal to one-tenth.

17. The method of claim 15, further wherein said ratio of the area of said compensation capacitor divided by the area of said first capacitor and said ratio of the size of said first compensation transistor divided by the size of said second compensation transistor is equal to one.

18. The method of claim 15, further wherein said first capacitor is a first PMOS transistor configured as a capacitor, said first PMOS transistor having a first PMOS transistor first flow electrode, a first PMOS transistor second flow electrode, a first PMOS transistor control electrode, and a first PMOS transistor biasing electrode, said first PMOS transistor first flow electrode being coupled to said first PMOS transistor second flow electrode, said first PMOS transistor biasing electrode and said first supply voltage, said first PMOS transistor control electrode being coupled to said first node and said third input of said biasing circuit; and said compensation capacitor is a compensation PMOS transistor configured as a capacitor, said compensation PMOS transistor having a compensation PMOS transistor first flow electrode, a compensation PMOS transistor second flow electrode, a compensation PMOS transistor control electrode, and a compensation PMOS transistor biasing electrode, said compensation PMOS transistor first flow electrode being coupled to said compensation PMOS transistor second flow electrode, said compensation PMOS transistor biasing electrode and said output of said biasing circuit, said compensation PMOS transistor control electrode being coupled to said second compensation transistor first flow electrode.

19. The method of claim 18, further wherein said first supply voltage is Vdd and said second supply voltage is Vss.

20. The method of claim 19, further wherein said first compensation transistor is an NMOS transistor; and said second compensation transistor is an NMOS transistor.

21. The method of claim 20, further wherein said ratio of the area of said compensation capacitor divided by the area of said first capacitor and said ratio of the size of said first compensation transistor divided by the size of said second compensation transistor is equal to one-tenth.

22. The method of claim 20, further wherein said ratio of the area of said compensation capacitor divided by the area of said first capacitor and said ratio of the size of said first compensation transistor divided by the size of said second compensation transistor is equal to one.

* * * * *